United States Patent
Lee et al.

(10) Patent No.: US 9,595,980 B2
(45) Date of Patent: Mar. 14, 2017

(54) OSCILLATION CIRCUIT AND TRANSMITTER INCLUDING THE SAME

(71) Applicant: Electronics and Telecommunications Research Institute, Daejeon (KR)

(72) Inventors: Hui Dong Lee, Daejeon (KR); Bong Hyuk Park, Daejeon (KR); Moon-Sik Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/680,838

(22) Filed: Apr. 7, 2015

(65) Prior Publication Data

US 2016/0112075 A1   Apr. 21, 2016

(30) Foreign Application Priority Data

Oct. 17, 2014  (KR) .......................... 10-2014-0140444

(51) Int. Cl.
*H04B 1/04* (2006.01)
*H04L 25/02* (2006.01)
*H03B 5/12* (2006.01)

(52) U.S. Cl.
CPC ......... *H04B 1/0458* (2013.01); *H03B 5/1212* (2013.01); *H03B 5/1228* (2013.01); *H03B 5/1243* (2013.01); *H04L 25/0278* (2013.01); *H04B 2001/0408* (2013.01)

(58) Field of Classification Search
CPC combination set(s) only.
See application file for complete search history.

(56) References Cited

U.S. PATENT DOCUMENTS

| 3,988,701 | A | * | 10/1976 | Funston | ................. | H03J 5/246 |
| | | | | | | 331/117 R |
| 7,414,488 | B2 | | 8/2008 | Lee et al. | | |
| 8,217,728 | B2 | | 7/2012 | Lee et al. | | |
| 2002/0014925 | A1 | * | 2/2002 | Ochiai | ................. | H03B 5/1228 |
| | | | | | | 331/117 FE |
| 2003/0095458 | A1 | | 5/2003 | Park et al. | | |
| 2004/0169564 | A1 | * | 9/2004 | Muramatsu | .......... | H03B 5/1265 |
| | | | | | | 331/177 V |
| 2007/0132522 | A1 | | 6/2007 | Lee et al. | | |

FOREIGN PATENT DOCUMENTS

| KR | 2003-0042058 A | 5/2003 |
| KR | 10-2007-0061176 A | 6/2007 |
| KR | 10-2012-0038275 A | 4/2012 |
| WO | WO 2008/069444 A1 | 6/2008 |

OTHER PUBLICATIONS

Lee, Jri, et al. "A low-power low-cost fully integrated 60-GHz transceiver system with OOK modulation and on-board antenna assembly." Solid-State Circuits, IEEE Journal of 45.2 (2010): 264-275.

* cited by examiner

*Primary Examiner* — Junpeng Chen
(74) *Attorney, Agent, or Firm* — NSIP Law

(57) ABSTRACT

Provided is an oscillation circuit including a voltage adjuster adjusting a magnitude of a power supply voltage according to a digital signal, an LC tank circuit connected between first and second nodes and generating a resonance signal on a basis of the magnitude adjusted power supply voltage, and a differential amplification circuit oscillating the resonance signal or modifying an oscillation state of the resonance signal to output first and second output voltage signals to the first and second nodes, respectively.

13 Claims, 6 Drawing Sheets

OSCILLATION CIRCUIT AND TRANSMITTER INCLUDING THE SAME

CROSS-REFERENCE TO RELATED APPLICATIONS

This U.S. non-provisional patent application claims priority under 35 U.S.C. §119 of Korean Patent Application No. 10-2014-0140444, filed on Oct. 17, 2014, the entire contents of which are hereby incorporated by reference.

BACKGROUND OF THE INVENTION

The present invention disclosed herein relates to a transmitter, and more particularly, to a transmitter oscillating to output a digital signal through an oscillation circuit.

A transmitter requires an oscillation circuit oscillating a digital signal at a high frequency and modulating the digital signal using an oscillation signal in a type required by a system. The oscillation circuit is required to oscillate a digital signal at least 5 times or greater and output the oscillated digital signal. Then, when the modulated output signal is smaller, the transmitter may include a power amplifier at a following stage.

A digital signal modulation method of an oscillation circuit include a modulation method by a manual switch, a modulation method using an amplifier, and a modulation method in an oscillation circuit itself. For a case of using an amplifier, it is difficult to implement a low power transmitter due to additional power consumption. For the modulation method through a manual switch, a large loss is caused by manual devices. In addition, an effect by parasitic components is great.

The modulation method in an oscillating circuit itself does not oscillate when a digital signal is '0' and starts to oscillate when the digital signal is '1'. At this point, the oscillation circuit has a minute output signal at initial oscillation, outputs a signal having gradually increased amplitude and finally outputs a signal having a saturated amplitude. However, in the modulation method by an oscillating circuit itself, an oscillation response speed may be slowed during a high speed operation.

SUMMARY OF THE INVENTION

The present invention provides a transmitter including an oscillation circuit operating in a high speed with lower power.

Embodiments of the present invention provide oscillation circuit including: a voltage adjuster adjusting a magnitude of a power supply voltage according to a digital signal; an LC tank circuit connected between first and second nodes and generating a resonance signal on a basis of the magnitude-adjusted power supply voltage; and a differential amplification circuit oscillating the resonance signal or modifying an oscillation state of the resonance signal to output first and second output voltage signals to the first and second nodes, respectively.

In some embodiments, the voltage adjuster may include a first switch adjusting a magnitude of the power supply voltage according to the digital signal to output the magnitude adjusted power supply voltage to the LC tank circuit.

In other embodiments, the LC tank circuit may include at least one inductor and a capacitor.

In still other embodiments, the differential amplification circuit may include a first transistor connected between the first node and a ground terminal; and a second transistor connected to the second node and the ground terminal.

In even other embodiments, the differential amplification circuit may further include: a third transistor connected to the first node; a second switch connected between the third transistor and the ground terminal; a fourth transistor connected to the second node; and a third switch connected between the fourth transistor and the ground terminal, wherein when the second and third switches are turned on according to the digital signal, the resonance signal is oscillated to generate a signal of a uniform amplitude through the first to fourth transistors, and when the second and third switches are turned off, the resonance signal is oscillated to generate a signal of relatively small amplitude through the first and second transistors, and the signal is output as the first and second output signal voltages.

In yet other embodiments, the differential amplification circuit may modify an oscillation amplitude state of the resonance signal according to turn-on or turn-off of the second and third switches.

In other embodiments of the present invention, transmitters include: an oscillation circuit including a first inductor and a capacitor connected in parallel to first and second nodes to output a resonance signal on a basis of a power supply voltage, a differential amplification circuit oscillating the resonance signal or modifying an oscillation state of the resonance signal according to a first digital signal to output as first and second output voltage signals, and a transformer configured with the first inductor and a second inductor connected in parallel to the first inductor for transforming the first and second output voltage signals into a single oscillation signal; and an antenna outputting the single oscillation signal.

In some embodiments, the differential amplification circuit may include: a first transistor connected between the first node and a ground terminal; a second transistor connected between the second node and the ground terminal; a third transistor connected to the first node; a first switch connected between the third transistor and the ground terminal; a fourth transistor connected to the second node; and a second switch connected between the fourth transistor and the ground terminal, wherein when the first and second switches are turned on by the first digital signal, the resonance signal is oscillated to generate a signal of a uniform amplitude by the first to fourth transistors, and when the first and second switches are turned off, the resonance signal is oscillated to generate a signal of a relatively small amplitude by the first and second transistors, and the signal is output as the first and second output voltage signals.

In other embodiments, the transmitter may further include a matching circuit matching impedances between the second inductor and the antenna.

In still other embodiments, the transmitter may further include a third switch disposed between the second inductor and the antenna and adjusting an output of the single oscillation signal by the second digital signal.

In even other embodiments, the transmitter may further include a voltage adjuster including a fourth switch for adjusting a magnitude of the power supply voltage output to the first inductor and the capacitor by the third digital signal.

In yet other embodiments, the transmitter may further include an inverter inverting one of the first to third digital signals to transform the inverted signal into a fourth digital signal; and a fifth switch connected between the capacitor and the differential amplification circuit and making short-circuit between the first and second nodes according to the fourth digital signal.

In further embodiments, the transmitter may further include a signal modifying unit including a plurality of delay elements for outputting the first to third digital signals.

In still further embodiments, the capacitor may be a varactor device.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

The foregoing features and following description with reference to the accompanying drawings is provided to assist in a comprehensive understanding of exemplary embodiments of the invention. In other words, the present invention is not limited to these embodiments and may be embodied in other types. The following embodiments are provided so that this disclosure will be thorough and complete, and will fully convey the scope of the invention to those skilled in the art. Accordingly, among methods of implementing components of the present invention, it will be clear to those of ordinary skill in the art that the present invention may be implemented with any of a specific method and a method of having identity Throughout this specification, when an element is referred to as "including" a particular component or when a procedure is referred to as "including" a particular step, it does not preclude another component but may further include the other component unless the context clearly indicates otherwise. In other words, the terms used herein is for the purpose of describing particular embodiments only and is not intended to be limiting concepts of the invention. Furthermore, embodiments described and exemplified herein include complementary embodiments thereof.

All terms used in the present invention have meanings that are understood commonly by a person having ordinary skill in the art. Ordinarily used terms should be understood to have the meaning consistent with their context. Unless clearly defined in the present disclosure, all terms used in the present invention should not be interpreted to be excessively idealistic or formalistic. The embodiments of the present invention will now be described with reference to the accompanying drawings.

Figure 1:
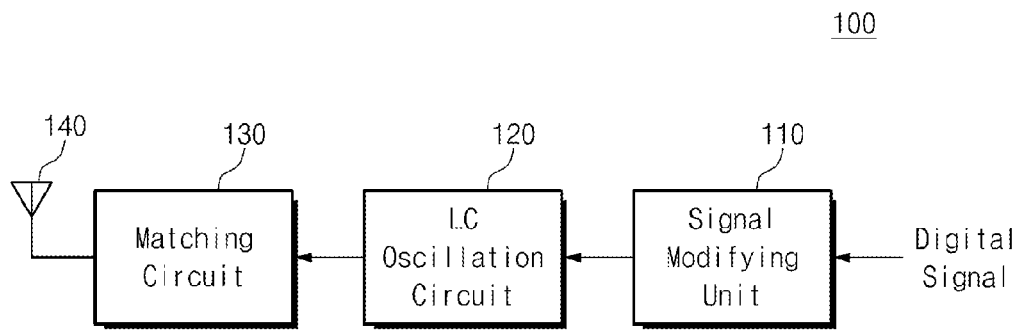
FIG. 1 is a block diagram illustrating a transmitter.

FIG. 1 is a block diagram illustrating a transmitter. Referring to FIG. 1, a transmitter 100 may include a signal modification unit 110, an LC oscillation circuit 120, a matching circuit 130, and an antenna 140.

The signal modifying unit 110 may receive a digital signal. The signal modifying unit 110 may generate various types of modified digital signals. A receiver (not illustrated) receiving a signal from the transmitter 100 requires a duty of 50% when demodulating the signal. Accordingly, the signal modifying unit 110 may modify a digital signal to provide a demodulated signal required by the receiver. In addition, the signal modifying unit 110 may output signals having different delay times and different pulse widths according to a block receiving a modified data signal. However, when it is not necessary to modify a digital signal, the digital signal may be directly transmitted to the LC oscillation circuit 120.

The LC oscillation circuit 120 receives a modified digital signal from the signal modifying unit 110. Alternatively, the LC oscillation circuit 120 may directly receive a digital signal from the outside. The LC oscillation circuit 120 may include an LC tank circuit and a differential amplification circuit. These will be described in detail with reference to other drawings.

The LC oscillation circuit 120 may oscillate according to the modified digital signal or the digital signal, change an oscillation state, and at the same time, output a modulated signal. The matching circuit 130 may receive the modulated signal. The matching circuit 130 includes a device for allowing impedances between the LC oscillation circuit 120 and the antenna 140 not to have a reflection loss. The matching circuit 130 may improve power efficiency and a signal to noise ratio by making the impedances equal to each other. The matching circuit 120 adjusts impedance and outputs a resonance signal to the antenna 140.

The antenna 140 may receive a signal from the matching circuit 130. The antenna 140 may output the received signal to the receiver (not illustrated).

Figure 2:
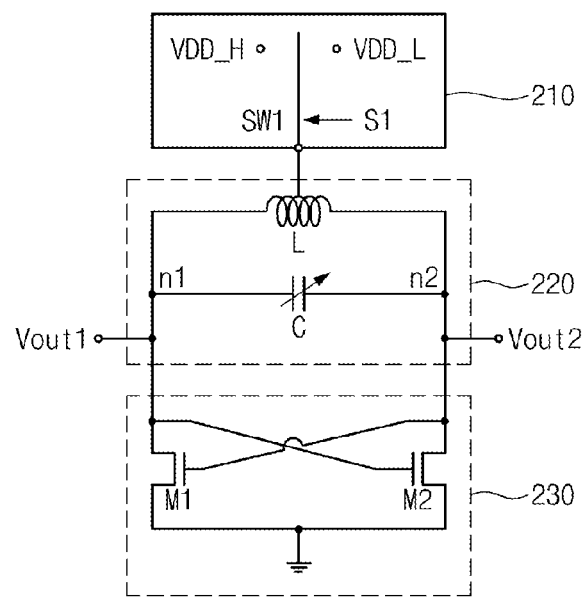
FIG. 2 is a circuit diagram illustrating on oscillation circuit according to a first embodiment of the invention.

FIG. 2 is a circuit diagram illustrating on oscillation circuit according to a first embodiment of the invention. Referring to FIG. 2, an oscillation circuit 200 according to the first embodiment may include a voltage adjuster 210, an LC tank circuit 220, and a differential amplification circuit 230.

The voltage adjuster 210 includes a first switch SW1. The voltage adjuster 210 may adjust a magnitude of a power supply voltage VDD according to a first digital signal S1 applied to the first switch SW1. The first switch SW1 may select a high power supply voltage VDD_H or a low power supply voltage VDD_L by the received first digital signal S1. In detail, the first digital signal S1 has a first voltage level L1 according to a high state High, and a second voltage level L2 according to a low state Low.

When the first digital signal S1 is of the first voltage level L1, the first switch SW1 may select the high power supply voltage VDD_H. At this point, the voltage adjuster 210 outputs the high power supply voltage VDD_H to the LC tank circuit 220. In addition, when the first digital signal S1 is of the second voltage level L2, the first switch SW1 may select the low power supply voltage VDD_L. At this point, the voltage adjuster 210 outputs the low power supply voltage VDD_L to the LC tank circuit 220.

In the first embodiment of the present invention, the voltage adjuster 210 may adjust the power supply voltage in two levels VDD_H and VDD_L. However, the magnitude of the power supply voltage that may be adjusted by the voltage adjuster 210 is not limited hereto. The voltage adjuster 210 may adjust the power supply voltage in various magnitudes.

The LC tank circuit 220 may include an inductor L and capacitor C. The inductor L and capacitor C are connected between the first and second nodes n1 and n2. The inductor L and capacitor C are connected in parallel between the first and second nodes n1 and n2. The LC tank circuit 220 receives the two level power supply voltages VDD_H and VDD_L from the voltage adjuster 210.

A current generated by the two level power supply voltages VDD_H and VDD_L flows through the inductor L and capacitor C. At this point, the capacitor C may be formed by parasitic components of various devices. The current flows through the inductor L through a process of charging and discharging the capacitor C by the two level power supply voltages VDD_H and VDD_L. Through this process, a resonance signal is generated and a resonance frequency of the oscillation signal 200 is determined.

In the present invention, the capacitor C may be a varactor device. A varactor device is a variable capacitor device of which capacitance is variable according to an applied voltage. The resonance signal is output to the differential amplification circuit 230 through the first and second nodes n1 and n2.

The differential amplification circuit 230 may include first and second transistors M1 and M2. The first and second transistors M1 and M2 may be NMOS transistors. However, an embodiment of the present invention is not limited hereto. A drain terminal of the first transistor M1 is connected to the first node n1 and a source terminal is connected to a ground terminal. In addition, a gate terminal of the first transistor M1 is connected to the second node n2. A drain terminal of the second transistor M2 is connected to the second node n2 and a source terminal is connected to a ground terminal. In addition, a gate terminal of the second transistor M2 is connected to the first node n1.

The first and second transistors M1 and M2 of the differential amplification circuit 230 are implemented in a complementary cross-coupled structure to make a negative resistance. The differential amplification circuit 230 oscillates a resonance signal applied through the first and second nodes n1 and n2 through the first and second transistors M1 and M2. The oscillated output signal is output in a type of first and second output voltage signals Vout1 and Vout2 at the first and second nodes n1 and n2. The first and second output voltage signals Vout1 and Vout2 have a phase difference of 180°.

An additional switch SW may be included between the LC tank circuit 220 and differential amplification circuit 230. The oscillation circuit 200 may make short-circuit or open between the first and second node n1 and n2 through the additional switch SW. Accordingly, the additional switch SW may adjust an oscillation state of the LC tank circuit 200.

In the oscillation circuit 200 like this, the voltage adjuster 210 provides the LC tank circuit 220 with two level power supply voltages VDD_H and VDD_L according to first and second voltage levels L2 and L2 of a first digital signal S1. Accordingly, the oscillation circuit 200 varied amplitude of an oscillation signal according to the two level power supply voltages VDD_H and VDD_L. In addition, in order to maintain oscillation even at the low power supply voltage VDD_L, the differential amplification circuit 230 is required to operate. Due to this, when a voltage level of the first digital signal S1 is changed from the second voltage level L2 to the first voltage level, a response speed efficiency is improved.

Figure 3:
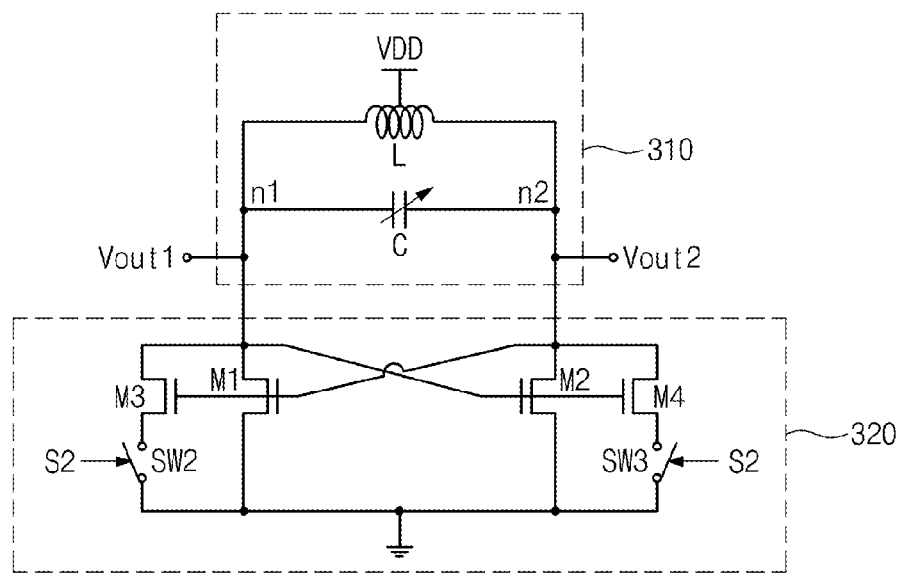
FIG. 3 is a circuit diagram illustrating on oscillation circuit according to a second embodiment of the invention.

FIG. 3 is a circuit diagram illustrating on oscillation circuit according to a second embodiment of the invention. Referring to FIG. 3, an oscillation circuit 300 according to a second embodiment may include an LC tank circuit 310, and a differential amplification circuit 320.

The LC tank circuit 310 may include an inductor L and capacitor C. The inductor L and capacitor C are connected between first and second nodes n1 and n2. The inductor L and capacitor C are connected in parallel between the first and second nodes n1 and n2. A power supply voltage VSS is applied to the LC tank circuit 310. An operation method of the LC tank circuit 310 is similar to that of the LC tank circuit 210 of FIG. 2.

The LC tank circuit 310 generates a resonance signal by characteristics of the inductor L and capacitor C, and determines a frequency of the resonance signal. The LC tank circuit 310 outputs the resonance signal to the differential amplification circuit 320 through the first and second nodes n1 and n2. The capacitor C of the LC tank circuit 310 may be a varactor device.

The differential amplification circuit 320 may include first to fourth transistors M1 to M4, and second and third switches SW2 and SW3. The first to fourth transistors M1 to M4 may be NMOS transistors. However, an embodiment of the present invention is not limited hereto. A drain terminal of the first transistor M1 is connected to the first node n1 and a source terminal is connected to a ground terminal. In addition, a gate terminal of the first transistor M1 is connected to the second node n2.

A drain terminal of the second transistor M2 is connected to the second node n2 and a source terminal is connected to a ground terminal. In addition, a gate terminal of the second transistor M2 is connected to the first node n1. A drain terminal of the third transistor M3 is connected to the first node n1 and a source terminal thereof is connected to the second switch SW2. In addition, a gate terminal of the third transistor M3 is connected to the second node n2. The second switch SW2 is connected between the third transistor M3 and the ground terminal.

Finally, a drain terminal of the fourth transistor M4 is connected to the second node n2 and a source terminal thereof is connected to the third switch SW3. In addition, a gate terminal of the fourth transistor M4 is connected to the first node n1. The third switch SW3 is connected between the fourth transistor M4 and the ground terminal.

The first and second transistors M1 and M2 have the same size. In addition, the third and fourth transistors M3 and M4 have the same size. However, an embodiment of the present invention is not limited hereto. The first to fourth transistors M1 to M4 may have different sizes. Each of the third and fourth transistors M3 and M4 receives a resonance signal from the LC tank circuit 310 according to turn-on or turn-off of the second and third switches SW2 and SW3.

The second and third switches SW2 and SW3 may be turned on or turned off according to a second digital signal S2. The second digital signal S2 has a first voltage level L1 according to a high state High, and a second voltage level L2 according to a low state Low. The second digital signal S2 may be same signal as the first digital signal S1. However, an embodiment of the present invention is not limited hereto. The second digital signal S2 and the first digital signal S1 may be digital signals having different phases and magnitudes.

The first and third transistors M1 and M3 and the second and fourth transistors M2 and M4 of the differential amplification circuit 320 are implemented in a complementary cross-coupled structure to make a negative resistance.

When the second digital signal S2 is of the second voltage level L2, the second and third switches SW2 and SW3 are turned off. Accordingly, a resonance signal applied from the LC tank circuit 310 is oscillated through the first and second transistors M1 and M2. In addition, the oscillated output signal is output as first and second output voltage signals Vout1 and Vout2 at the first and second nodes n1 and n2.

When the second digital signal S2 is of the first voltage level L1, the second and third switches SW2 and SW3 are turned on. Accordingly, a resonance signal applied from the LC tank circuit 310 is oscillated through the first to fourth transistors M1 to M4. In addition, the oscillated output signal is output as first and second output voltage signals Vout1 and Vout2 at the first and second nodes n1 and n2. The first and second output voltage signals Vout1 and Vout2 have a phase difference of 180°.

An additional switch SW may be included between the LC tank circuit 310 and differential amplification circuit 320. Due to the additional switch SW, an oscillation state may be adjusted by making short-circuit or open between the first and second node n1 and n2. The oscillation circuit 300 according to the second embodiment of the present invention includes additional transistors M3 and M4 in the differential amplification circuit 310. In addition, the second and third switches SW2 and SW3 connected to the third and fourth transistors M3 and M4 are turned on or turned off according to the magnitude of the second digital signal S2 and thereby amplitudes of the first and second output voltage signals Vout1 and Vout2 may be efficiently adjusted.

In detail, when the second digital signal S2 is of the first voltage level L1, the third and fourth transistors M3 and M4 are turned on and thereby the first and second output voltage signals Vout1 and Vout2 may be oscillated as signals having large amplitudes. When the second digital signal S2 is of the second voltage level L2, the third and fourth transistors M3 and M4 are turned off and thereby the first and second output voltage signals Vout1 and Vout2 may be oscillated as signals having small amplitudes. Accordingly, power consumption may be reduced. In addition, when the second digital signal S2 is transitioned from the second level L2 to the first voltage level L1, the first and second output voltage signals Vout1 and Vout2 having small amplitudes may be rapidly changed to have large amplitudes. Accordingly, a response efficiency becomes improved.

Figure 4:
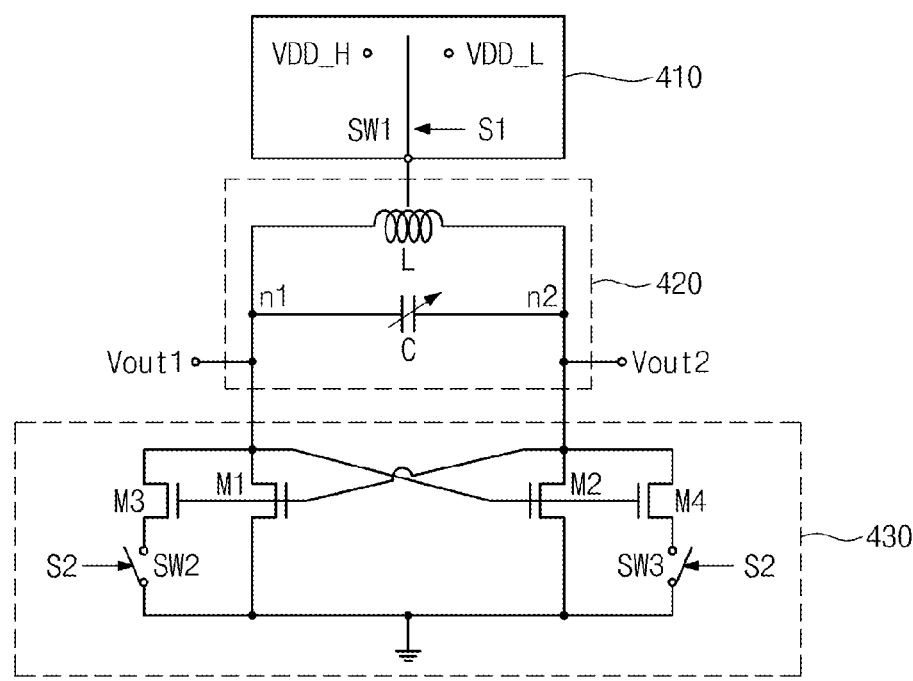
FIG. 4 is a circuit diagram illustrating on oscillation circuit according to a third embodiment of the invention.

FIG. 4 is a circuit diagram illustrating on oscillation circuit according to a third embodiment of the invention. Referring to FIG. 4, an oscillation circuit 400 according to a third embodiment may include a voltage adjustor 410, an LC tank circuit 420, and a differential amplification circuit 430.

Referring to FIGS. 2 and 4, an oscillation circuit 400 according to a fourth embodiment of the present invention has a structure in which the voltage adjuster 210 of FIG. 2 and the differential amplification circuit 320 of FIG. 3 are coupled. The first switch SW1 of the voltage adjuster 410 is turned on or turned off by a first digital signal S1.

The second and third switches SW2 and SW3 of the differential amplification circuit 430 may be turned on or turned off according to a second digital signal S2. The first and second digital signals S1 and S2 have a first voltage level L1 according to a high state High, and a second voltage level L2 according to a low state Low. The second digital signal S2 may be the same signal as the first digital signal S1. However, an embodiment of the present invention is not limited hereto. The second digital signal S2 and the first digital signal S1 may be digital signals having different phases and magnitudes.

When the first digital signal S1 is of the first voltage level L1, the voltage adjuster 410 outputs the high power supply voltage VDD_H to the LC tank circuit 420. In addition, when the first digital signal S1 is of the second voltage level L2, the voltage adjuster 410 outputs the low power supply voltage VDD_L to the LC tank circuit 420.

The LC tank circuit 420 has a structure in which an inductor L and capacitor C are connected in parallel between first and second nodes n1 and n2. The LC tank circuit 420 generates a resonance signal on the basis of the two level power supply voltages VDD_H and VDD_L through the inductor L and capacitor C. The LC tank circuit 420 outputs the resonance signal to the differential amplification circuit 430 through the first and second nodes n1 and n2.

The differential amplification circuit 430 may include first to fourth transistors M1 to M4, and second and third switches SW2 and SW3. The first to fourth transistors M1 to M4 may be NMOS transistors. However, an embodiment of the present invention is not limited hereto. When the second digital signal S2 is of the first voltage level L1, the second and third switches SW2 and SW3 of the differential amplification circuit 420 are turned on. Accordingly, the oscillated first and second output voltage signals Vout1 and Vout2 are output through the cross-coupled first to fourth transistors M1 to M4.

When the second digital signal S2 is of the first voltage level L2, the second and third switches SW2 and SW3 of the differential amplification circuit 430 are turned off. Accordingly, signals are oscillated through the first and second transistors M1 and M2 at the low power supply voltage VDD_L. The oscillated signals are output as the first and second output voltage signals Vout1 and Vout2 at the first and second nodes n1 and n2.

An additional switch SW may be included between the LC tank circuit 420 and differential amplification circuit 430. Due to the additional switch SW, an oscillations state may be adjusted by making short-circuit or open between the first and second node n1 and n2.

Figure 5:
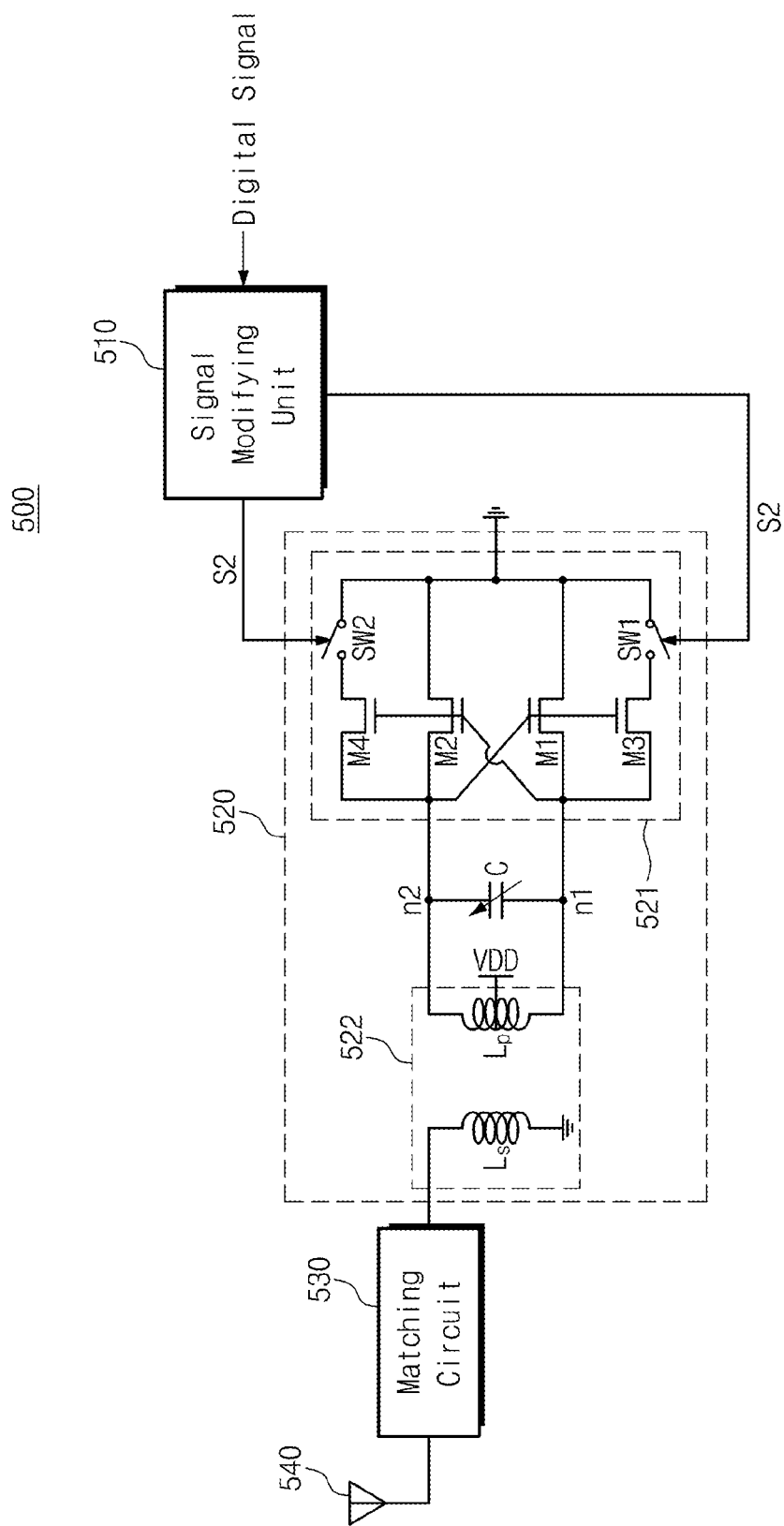
FIG. 5 is a circuit diagram illustrating a transmitter according to a first embodiment of the invention.

FIG. 5 is a circuit diagram illustrating a transmitter according to a first embodiment of the invention. FIG. 5 illustrates a transmitter in which a transformer is used in the oscillation circuit according to the second embodiment. Referring to FIGS. 1, 3, and 5, a transmitter 510 according to a first embodiment of the present invention may include a signal modifying unit 510, an oscillation circuit 530, and an antenna 540.

The signal modifying unit 510 may include a plurality of delay elements. The signal modifying unit 510 may receive a digital signal and modify the received digital signal to output the modified signal. The signal modifying unit 510 may be omitted. The signal modifying unit 510 outputs a first digital signal S1 to the oscillation circuit 520. The first digital signal S1 has a first voltage level L1 according to a high state High, and a second voltage level L2 according to a low state Low.

The oscillation circuit 520 includes the same circuit as the oscillation circuit 300 of FIG. 3. In detail, the oscillation circuit 520 includes a differential amplification circuit 521 connected to the first and second nodes n1 and n2, and a first inductor Lp and a capacitor C connected in parallel between first and second nodes n1 and n2. In addition, the oscillation circuit 520 further includes a second inductor Ls connected in parallel to the first inductor Lp. The first and second inductors Lp and Ls operate as the transformer 522.

The oscillation circuit 520 of FIG. 5 operates similarly to the oscillation circuit 300 of FIG. 3. In detail, the power supply voltage VDD is output to the first inductor Lp and capacitor C connected in parallel to the first and second nodes n1 and n2. The first inductor Lp and capacitor C may resonate at the power supply voltage VDD to generate a resonance signal, and determine a resonance frequency of the resonance signal. The first inductor Lp and capacitor C outputs the resonance signal to the differential amplification circuit 521 through the first and second nodes n1 and n2.

The differential amplification circuit 521 generates negative resistance to maintain resonance. The differential amplification circuit 521 may include first to fourth transistors M1 to M4, and first and second switches SW1 and SW2. A structure of the differential amplification circuit 521 is the same as that of the differential amplification circuit 320 of FIG. 3. Accordingly, when the second digital signal S2 is of the second voltage level L1, the first and second switches SW1 and SW2 are turned on. The differential amplification circuit 521 generates negative resistance so that oscillation of the resonance signal is maintained through the first to fourth transistors M1 to M4.

When the second digital signal S2 is of the second voltage level L2, the first and second switches SW1 and SW2 are turned on. Accordingly, the differential amplification circuit 521 generates negative resistance so that oscillation of the resonance signal is maintained through the first to fourth transistors M1 to M4. Referring to FIGS. 3 and 5, a signal oscillated through the differential amplification circuit 521 is output as the first and second output voltage signals Vout1 and Vout2. The first and second output voltage signals Vout1 and Vout2 generated through the differential amplification circuit 521 are transformed into a single oscillation signal through the transformer 522. The first and second output voltage signals Vout1 and Vout2 have a phase difference of 180°.

The transformer 522 has a structure including magnetically connected first and second inductors Lp and Ls. Each of the first and second inductors Lp and Ls forms the transformer 522 as primary and secondary coils. The second inductor Ls receives the first and second output voltage signals Vout1 and Vout2 through the first inductor Lp. The second inductor Ls performs cross-coupling on the first and second output voltage signals Vout1 and Vout2 and transforms them into the single oscillation signal. The transformer 522 outputs the signal oscillation signal to the matching circuit 530. The transformer 533 implemented through the first and second inductors Lp and Ls simplifies a structure of the transmitter 500. Accordingly, there is an effect that a volume of the transmitter 500 is reduced.

The matching circuit 530 may receive the single oscillation signal. The matching circuit 530 includes a device for allowing impedances between an output stage of the second inductor Ls and the antenna 540 to be identical in order not to have a reflection loss. The matching circuit 530 may improve power efficiency and a signal to noise ratio by making the impedances equal to each other. The matching circuit 120 adjusts impedance and outputs the single oscillation signal to the antenna 540.

The antenna 540 may output the single oscillation signal to the receiver (not illustrated).

Figure 6:
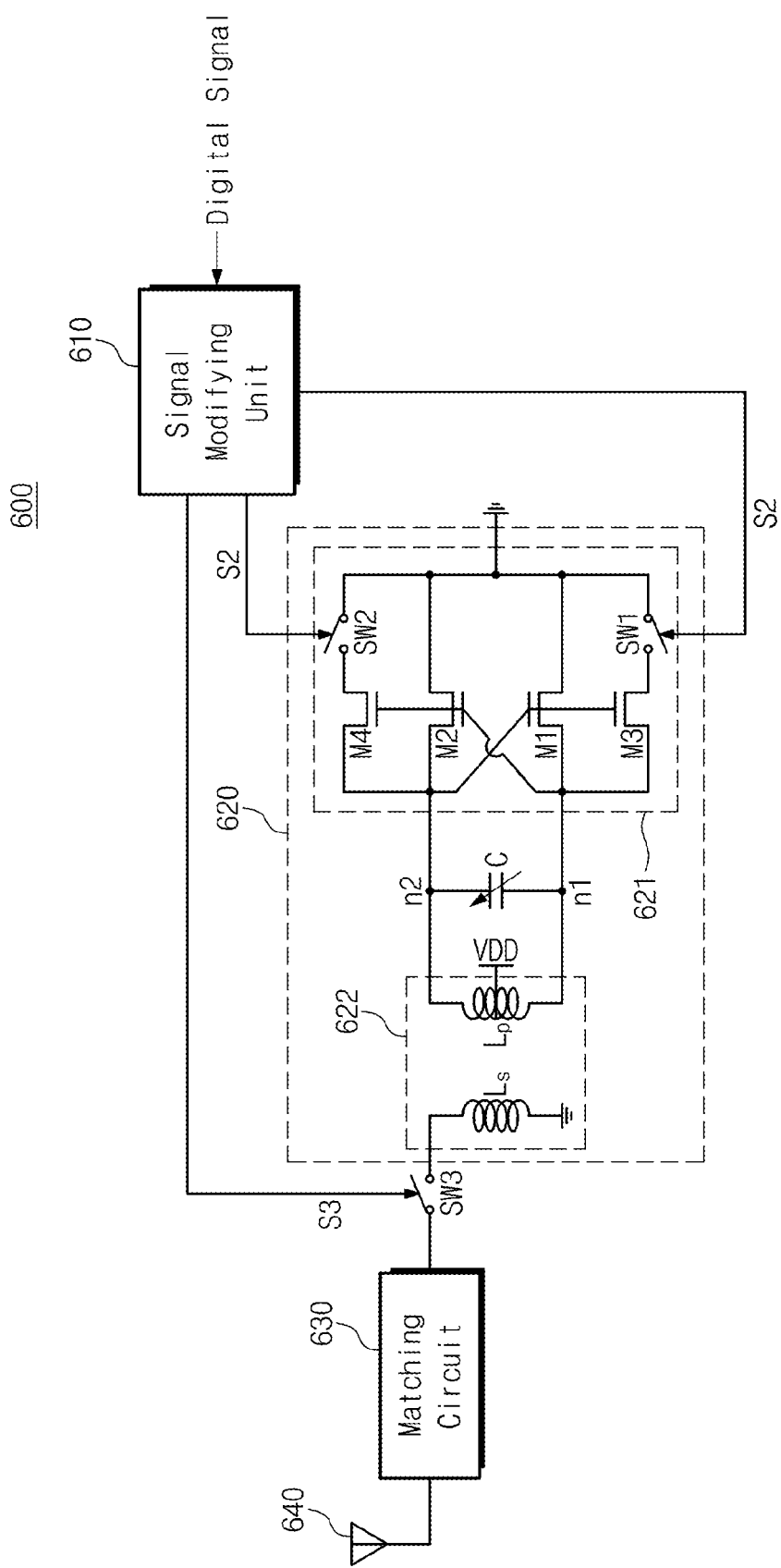
FIG. 6 is a circuit diagram illustrating a transmitter according to a second embodiment of the invention.

FIG. 6 is a circuit diagram illustrating a transmitter according to a second embodiment of the invention. Referring to FIGS. 5 and 6, a transmitter 600 according to a second embodiment of the present invention may include a signal modifying unit 610, an oscillation circuit 620, a third switch SW3, a matching circuit 630, and an antenna 640. The transmitter 600 illustrated in FIG. 6 includes a structure in which the third switch SW3 is added to the transmitter 500 illustrated in FIG. 5. The transmitter 600 includes the third switch SW3 between the oscillation circuit 520 and the matching circuit 630.

According to an embodiment of the present invention, the third switch SW3 is connected in serial between the oscillation circuit 620 and the matching circuit 630. However, an embodiment of the present invention is not limited hereto. The third switch SW3 may be connected in parallel between the oscillation circuit 620 and the matching circuit 630.

The third switch SW3 receives a third digital signal S3 from the signal modifying unit 610. The third digital signal S3 may be the same as the second digital signal S2 applied to the first and second switches SW1 and SW2. In addition, the third digital signal S3 may be a delayed signal than the second digital signal S2. When the first to third switches SW1 to SW3 are turned on by the second and third digital signals S2 and S3, the single oscillation signal is output. In addition, when the first to third switches SW1 to SW3 are turned off by the second and third digital signals S2 and S3, the single oscillation signal is not output. In such a way, the third switch SW3 outputs only a region in the single oscillation signal, which corresponds to the first digital signal S1 of the first voltage level L1. Accordingly, output accuracy of the transmitter 600 is improved.

Figure 7:
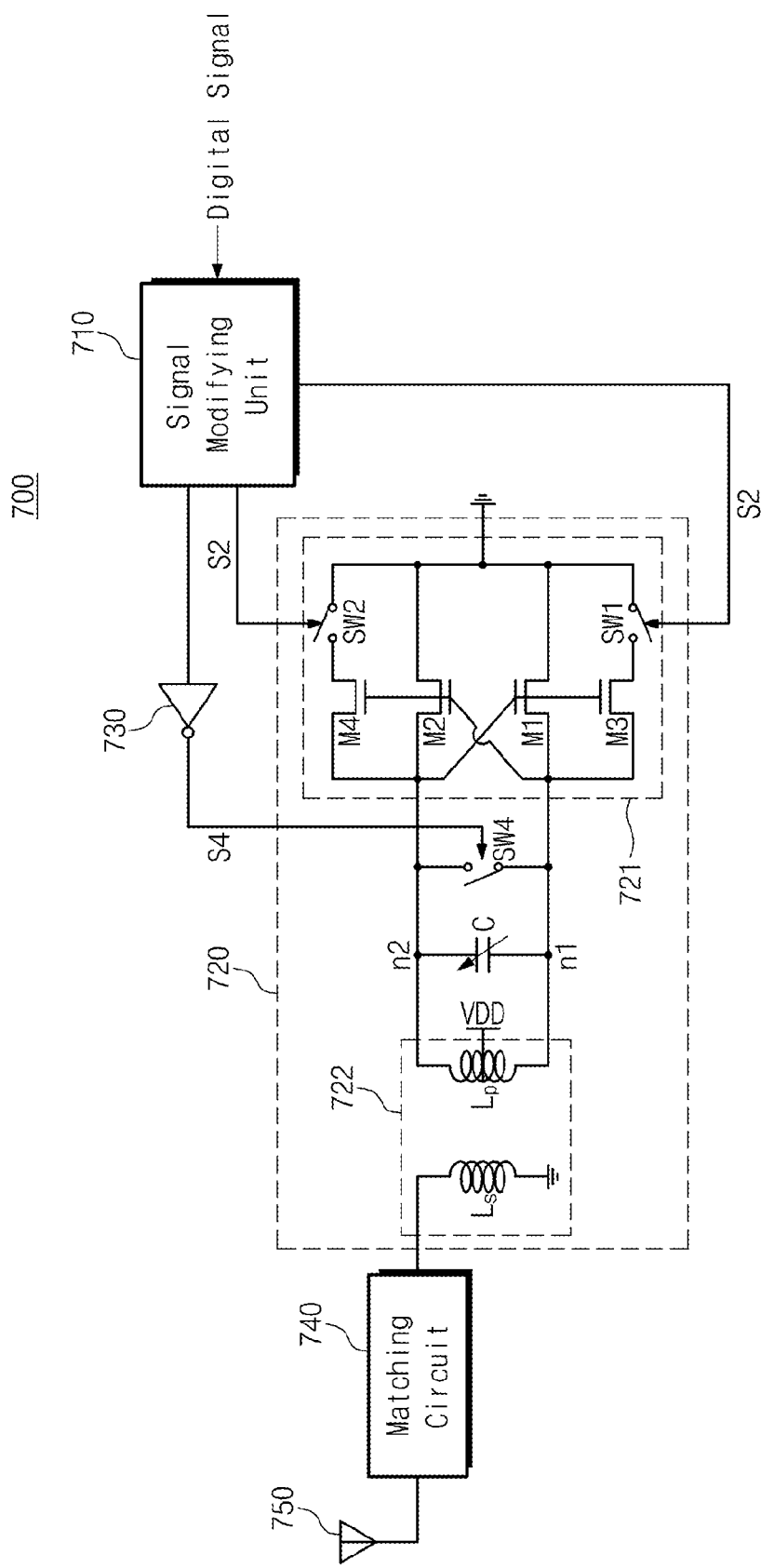
FIG. 7 is a circuit diagram illustrating a transmitter according to a third embodiment of the invention.

FIG. 7 is a circuit diagram illustrating a transmitter according to a third embodiment of the invention. Referring to FIGS. 5 to 7, a transmitter 700 according to a third embodiment of the present invention may include a signal modifying unit 710, an oscillation circuit 720, an inverter 730, a matching circuit 740, and an antenna 750. The transmitter 700 illustrated in FIG. 7 includes a similar structure to the transmitter 600 illustrated in FIG. 6.

The transmitter 700 according to the fourth embodiment has a structure in which a fourth switch SW4 is included inside the oscillation circuit 720. In detail, the fourth switch SW4 is connected between a capacitor C and a differential amplification circuit 721. In detail, one terminal of the fourth switch SW4 is connected to the first node n1 and the other terminal is connected to the second node n2. The fourth switch SW4 is connected to the inverter 730.

The inverter 730 provides a fourth digital signal S4 that the second digital signal S2 is inverted to the fourth switch SW4. In addition, the inverter 730 inverts one of the first to third digital signals S1 to S3 delayed and output from the signal modifying unit 710 and output the inverted signal as the fourth digital signal S4.

When the fourth switch SW4 is turned on, the first and second switches SW1 and SW2 are turned off. When the fourth switch SW4 is turned off, the first and second switches SW1 and SW2 are turned on. In other words, the first and second switches SW1 and SW2 and the fourth switch SW4 perform complementary operations to each other. The fourth switch SW4 may adjust oscillation by making short-circuit or open between the first and second node n1 and n2.

Figure 8:
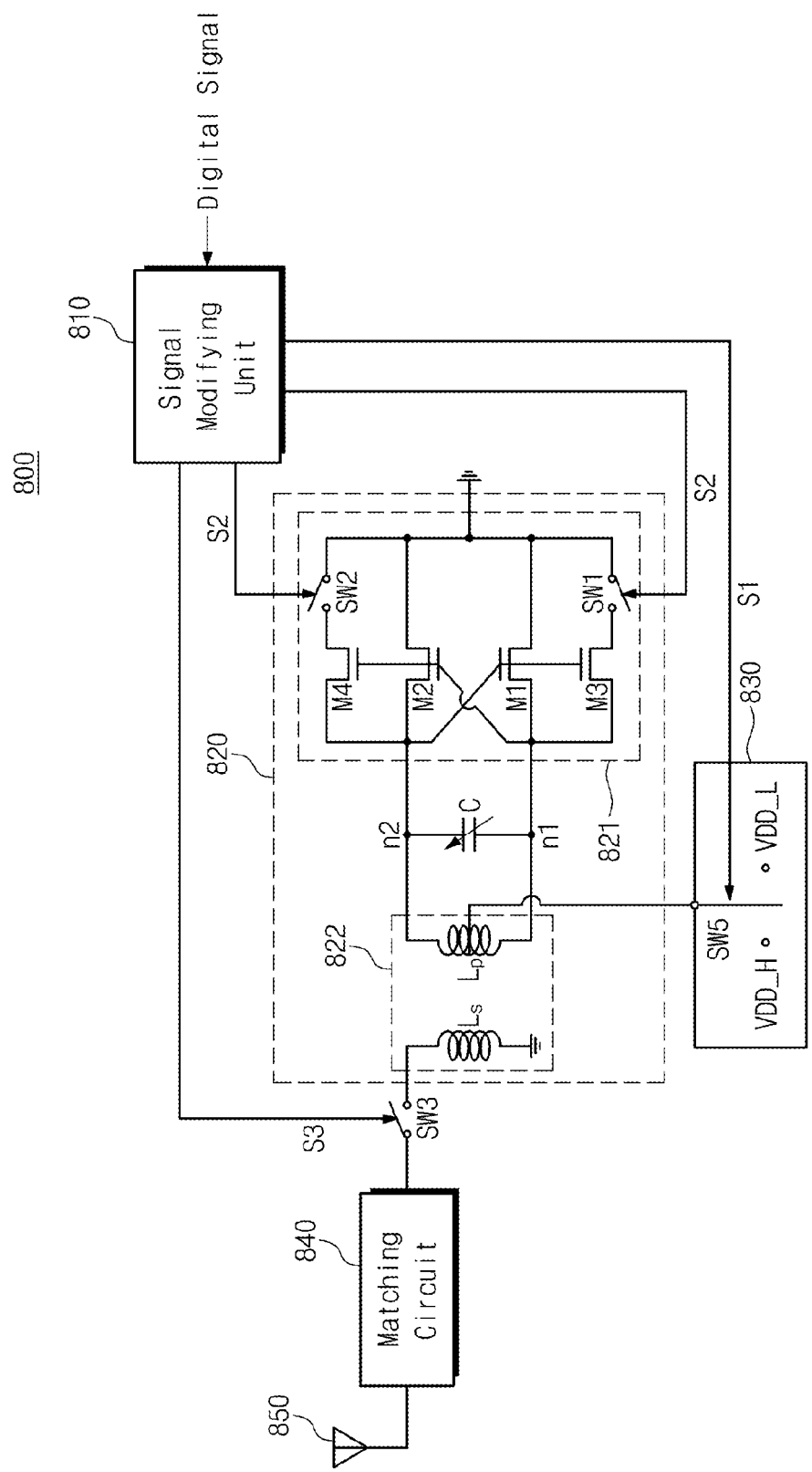
FIG. 8 is a circuit diagram illustrating a transmitter according to a fourth embodiment of the invention.

FIG. 8 is a circuit diagram illustrating a transmitter according to a fourth embodiment of the invention. Referring to FIGS. 4 and 8, a transmitter 800 according to a fourth embodiment of the present invention may include a signal modifying unit 810, an oscillation circuit 820, a voltage adjuster 830, the fourth switch SW4, a matching circuit 840, and an antenna 850.

The oscillation circuit 820 illustrated in FIG. 8 includes a similar configuration to the oscillation circuit 400 illustrated in FIG. 4. In detail, the oscillation circuit 820 includes a structure of a transformer 822 in which a second inductor Ls is further magnetically coupled to the first inductor Lp. In addition, the voltage adjuster 830 is included which supplies a power supply voltage to the first inductor Ls and capacitor C connected in parallel to the first and second nodes n1 and n2 of the oscillation circuit 520.

The voltage adjuster 830 includes a fifth switch SW5. The fifth switch SW5 of the voltage adjuster 830 may select two level power supply voltages VDD_H and VDD_L according to the first digital signal S1. The first digital signal S1 has a first voltage level L1 according to a high state High, and a second voltage level L2 according to a low state Low.

The oscillation circuit 820 may maintain oscillation even at the lower power supply voltage VDD_L by the voltage adjuster 830. In addition, the oscillation at the low power supply voltage VDD_L may be adjustable minutely by the second and third switches SW2 and SW3 of the differential amplification circuit 822 included in the oscillation circuit 820.

According to an embodiment of the present invention, the third switch SW3 is connected in serial between the oscillation circuit 820 and the matching circuit 840. However, an embodiment of the present invention is not limited hereto. The third switch SW3 may be connected in parallel between the oscillation circuit 820 and the matching circuit 840.

A device configuration illustrated each block diagram is to assist in understanding the invention. Each block may be formed with blocks of smaller units. Alternatively, the plurality of blocks may form a larger unit block according to functions thereof. In other words, the technical idea of the present invention is not limited to a configuration illustrated in a block diagram.

According to embodiments of the present invention, an oscillation circuit having improved power efficiency and operating in a high speed and a transmitter including the same can be provided.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An oscillation circuit comprising:
a voltage adjuster adjusting a magnitude of a power supply voltage according to a digital signal;
an LC tank circuit connected between first and second nodes and generating a resonance signal on a basis of the magnitude-adjusted power supply voltage; and
a differential amplification circuit oscillating the resonance signal or modifying an oscillation state of the resonance signal to output a first output voltage signal to the first node and output a second output voltage signal to the second node,
wherein the differential amplification circuit comprises:
a first transistor connected to the first node and a ground terminal;
a second transistor connected to the second node and the ground terminal;
a third transistor connected to the first node;
a second switch connected between the third transistor and the ground terminal;
a fourth transistor connected to the second node; and
a third switch connected between the fourth transistor and the ground terminal.

2. The oscillation circuit of claim 1, wherein the voltage adjuster comprises a first switch adjusting a magnitude of the power supply voltage according to the digital signal to output the magnitude adjusted power supply voltage to the LC tank circuit.

3. The oscillation circuit of claim 1, wherein the LC tank circuit comprises at least one inductor and a capacitor.

4. The oscillation circuit of claim 1,
wherein in response to the digital signal turning on the second and third switches, the resonance signal is oscillated to generate a signal of a first amplitude through the first to fourth transistors, and in response to the digital signal turning off the second and third switches, the resonance signal is oscillated to generate a signal of second amplitude through the first and second transistors, and the signal is output as the first and second output voltages.

5. The oscillation circuit of claim 4, wherein the differential amplification circuit modifies an oscillation amplitude state of the resonance signal according to turn-on or turn-off of the second and third switches.

6. A transmitter comprising:
an oscillation circuit comprising a first inductor and a capacitor connected in parallel to first and second nodes to output a resonance signal on a basis of a power supply voltage,
a differential amplification circuit oscillating the resonance signal or modifying an oscillation state of the resonance signal according to a first digital signal to output as first and second output voltage signals,
a transformer configured with the first inductor and a second inductor connected in parallel to the first inductor for transforming the first and second output voltage signals into a single oscillation signal; and
an antenna outputting the single oscillation signal,
wherein the differential amplification circuit comprises:
a first transistor connected between the first node and a ground terminal;
a second transistor connected between the second node and the ground terminal;
a third transistor connected to the first node;
a first switch connected between the third transistor and the ground terminal;
a fourth transistor connected to the second node; and
a second switch connected between the fourth transistor and the around terminal.

7. The transmitter of claim 6,
wherein in response to the first digital signal turning on the first and second switches, the resonance signal is oscillated to generate a signal of a first amplitude by the first to fourth transistors, and in response to the first digital signal turning off the first and second switches, the resonance signal is oscillated to generate a signal of a second amplitude by the first and second transistors, and the signal is output as the first and second output voltage signals.

8. The transmitter of claim 6, further comprising a matching circuit matching impedances between the second inductor and the antenna.

9. The transmitter of claim 8, further comprising a third switch disposed between the second inductor and the matching circuit and adjusting an output of the single oscillation signal by a second digital signal.

10. The transmitter of claim 6, further comprising a voltage adjuster comprising a fourth switch for adjusting a magnitude of the power supply voltage output to the first inductor and the capacitor by a third digital signal.

11. The transmitter of claim 10, further comprising an inverter inverting one of the first to third digital signals to transform the inverted signal into a fourth digital signal; and
  a fifth switch connected between the capacitor and the differential amplification circuit and making short-circuit between the first and second nodes according to the fourth digital signal.

12. The transmitter of claim 11, further comprising a signal modifying unit including a plurality of delay elements for outputting the first to third digital signals.

13. The transmitter of claim 6, wherein the capacitor is a varactor device.

\* \* \* \* \*